Figure 1:
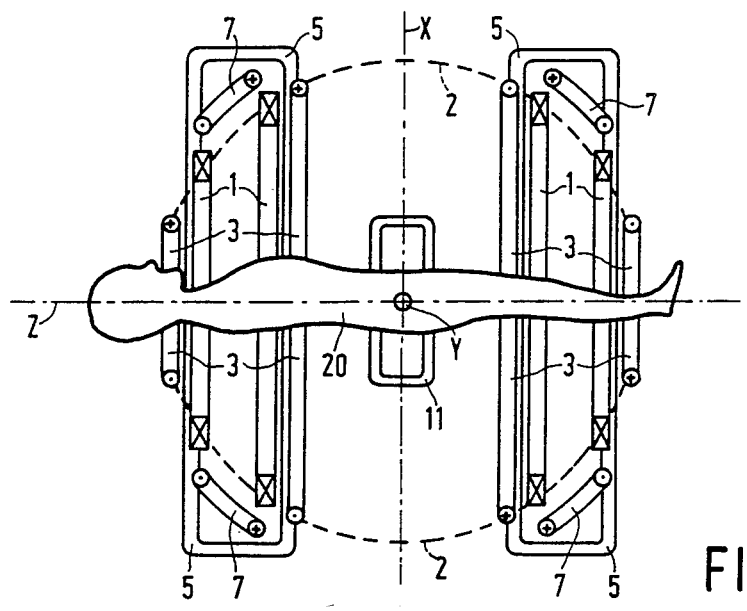

United States Patent [19]

McKinnon

[11] Patent Number: 4,843,549
[45] Date of Patent: Jun. 27, 1989

[54] METHOD OF DETERMINING THE SPECTRAL DISTRIBUTION OF THE NUCLEAR MAGNETIZATION IN A LIMITED VOLUME, AND DEVICE FOR PERFORMING THE METHOD

[75] Inventor: Graeme C. McKinnon, Ellerau, Fed. Rep. of Germany

[73] Assignee: U.S. Philips Corporation, New York, N.Y.

[21] Appl. No.: 15,416

[22] Filed: Feb. 17, 1987

[30] Foreign Application Priority Data

Feb. 21, 1986 [DE] Fed. Rep. of Germany ....... 3605547
May 17, 1986 [DE] Fed. Rep. of Germany ....... 3616749

[51] Int. Cl.$^4$ ............................................. G01N 27/00
[52] U.S. Cl. ................................. 364/413.13; 324/309
[58] Field of Search ...................... 324/309, 307, 312; 364/414

[56] References Cited

U.S. PATENT DOCUMENTS

| | | | |
|---|---|---|---|
| 4,354,157 | 10/1982 | Feiner | 324/309 |
| 4,644,278 | 2/1987 | Sano et al. | 324/309 |
| 4,682,110 | 7/1982 | den Boef | 324/309 |
| 4,712,066 | 12/1987 | Luyten et al. | 324/309 |

*Primary Examiner*—Jerry Smith
*Assistant Examiner*—Kim Thanh Tbui
*Attorney, Agent, or Firm*—Thomas A. Briody; Jack E. Haken; Jack D. Slobod

[57] ABSTRACT

Apparatus and method of determining the spectral distribution of the nuclear magnetization in a limited volume, in which the nuclear magnetization is excited in three mutually perpendicular layers by means of three successive high-frequency pulses. The stimulated echo signal generated at the area of intersection of the three layers is subjected to a Fourier transformation. The spin resonance signals additionally generated by the three high-frequency pulses are suppressed in that magnetic gradient fields are activated during the three intervals between the high-frequency pulses and between the last high-frequency pulse and the stimulated echo signal.

8 Claims, 3 Drawing Sheets

METHOD OF DETERMINING THE SPECTRAL DISTRIBUTION OF THE NUCLEAR MAGNETIZATION IN A LIMITED VOLUME, AND DEVICE FOR PERFORMING THE METHOD

The invention relates to a method of determining the spectral distribution of the nuclear magnetization in a limited volume, in which three high-frequency pulses act on the examination zone each time in conjunction with a magnetic gradient field, in the presence of a steady, uniform magnetic field, the direction of the gradient of the magnetic gradient field being varied 90° from one pulse to another, the stimulated echo signal generated in the examination zone being sampled and processed, and also relates to a device for performing the method.

A method of this kind is essentially known from the magazine J. Magn. Reson. 64 (1985), pp. 479 to 486, notably page 482, be it not in conjunction with the determination of the spectral distribution of the nuclear magnetization but rather in conjunction with the determination of diffusion coefficients in the volume. The three high-frequency pulses which act on the examination zone each time in conjunction with a magnetic gradient field excite the nuclear magnetization in three mutually perpendicular layers. Inter alia a stimulated echo signal is thus generated in the limited volume element in which the three layers intersect. As is known, a stimulated echo signal occurs in the case of three successive high-frequency pulses, the distance between the time centre of this signal and the centre of the third high-frequency pulse corresponding to the distance between the centres of the first two high-frequency pulses.

Furthermore, from the magazine J. Magn. Reson. 56 (1984), pp. 350 to 354, a method for selective volume excitation is known in which three magnetic gradient fields with mutually perpendicular gradients are activated during three successive timer intervals. During each of these three time intervals two narrow-band 45° high-frequency pulses are generated and one wide-band 90° high-frequency pulse. As a result, the nuclear magnetization in three mutually perpendicular layers whose thickness is determined by the bandwidth of the 45° pulses is maintained in the z-direction, whilst outside the layers it is tilted to the x-y plane where the magnetization is quickly dephased under the influence of a magnetic gradient field applied subsequent to the three time intervals. Therefore, when one or more high-frequency pulses subsequently act on the examination zone, only the volume element which is situated at the point of intersection of the three layers will make a contribution to the spin resonance signal thus generated.

It is the object of the invention to provide a simple method of determining the spectral distribution of the nuclear magnetization in an examination zone.

On the basis of a method of the kind set forth, this object is achieved in that a magnetic gradient field is activated during each time interval between the three high-frequency pulses as well as between the third high-frequency pulse and the stimulated echo signal, the gradient of the gradient field generated in the time interval after the first high-frequency pulse and after the third high-frequency pulse extending in the same direction and the condition $I1=I3$ being satisfied, where $I1$ and $I3$ denote the time integral over the gradient in the interval after the first and after the third high-frequency pulse, respectively, the gradient of the gradient field activated during the interval after the second high-frequency pulse extending perpendicularly to the gradients of the gradient fields activated during the interval after the first and the third interval, respectively, and/or the condition $I1=I2/n$ being satisfied, where $I2$ denotes the time integral over the gradient of the gradient field activated after the second high-frequency pulse and $n$ is a positive or negative number whose absolute value deviates from 1 and 2, the sampling values of the stimulated echo signal being applied to a Fourier transformation unit.

In accordance with the invention, the nuclear magnetization is excited in three mutually perpendicular layers by the three high-frequency pulses in conjunction with the respective activated gradient fields. A stimulated echo signal is supplied only by the area where these three layers intersect. The spectrum of this echo signal, obtained by Fourier transformation, offers the spectral distribution of the nuclear magnetization at the area of intersection of the three layers.

At the area of intersection of the three layers, but partly also in the layers outside this area, not only stimulated echo signals are generated, but also further spin resonance signals. For example, each of the three high-frequency pulses causes a free induction decay which is linked to a so-called FID signal which occurs immediately after the high-frequency pulse and which depends on the nuclear magnetization in the total layer each time excited. Moreover, there also occur various spin echo signals, at least some of which depend on the nuclear magnetization at the area of intersection of two of the three layers, i.e. also outside the volume element to be excited. These signals are also more or less active when the stimulated echo signal occurs and falsify the measurement result, because they depend mainly on the nuclear magnetization outside the volume determined by the three layers. Therefore, it is important to suppress all signals except for the stimulated echo signal.

To this end, during each of the three intervals between the three high-frequency pulses and between the third high-frequency pulse and the appearance of the stimulated echo signal a magnetic gradient field is activated and deactivated. Consequently, the phase of the nuclear magnetization in the direction of the gradient of the magnetic gradient field depends on the location. The duration, the magnitude and the direction of the gradients of these magnetic gradient fields are chosen so that, because of the dephasing thus introduced, the nuclear magnetization does not contribute to the various spin resonance signals except for the stimulated echo signal.

Use is made of the fact that a magnetic gradient field has no effect on the stimulated echo signal during the interval between the second and the third high-frequency pulse and that a magnetic gradient field after the first high-frequency pulse has the opposite effect on such a signal in comparison with a magnetic gradient field (having the same direction, duration and amplitude) after the third high-frequency pulse. Therefore, when the time integral over the magnetic gradient field after the first high-frequency pulse equals the corresponding integral after the third high-frequency pulse, there will not be an effect on the stimulated echo signal, but the three FID signals and a part of the spin echo signals will already be suppressed. The residual spin echo signals can also be suppressed by a suitable choice of the direction, duration and intensity of the magnetic gradient field active during the interval after the second high-frequency pulse. This is the case when the gradient of this gradient field extends in a direction other than that of the gradient of the gradient fields active during the intervals after the first and the third high-frequency pulse and/or when the condition I1=I2/n is satisfied.

The three high-frequency pulses must have the same flip angle; preferably, all three high-frequency pulses are so-called 90° pulses.

It is known that the nuclear magnetization within and perpendicularly to the excited layer is dephased under the influence of a magnetic gradient field during a high-frequency pulse. Such dephasing can be eliminated in known manner (see, for example Phys. Med. Biol., Vol. 25, 1980, pp. 751 to 756, notably FIG. 1) by reversing the polarity of the magnetic gradient field after the high-frequency pulse; the time integral over the magnetic gradient field between the centre of the high-frequency pulse and the instant of deactivation of this gradient field must then be zero.

However, it has been found that, when the three mutually perpendicular layers are excited using the method in accordance with the invention, dephasing cannot be completely eliminated, so that the stimulated echo signal formed is comparatively weak or has a comparatively poor signal-to-noise ratio. The described dephasing or the resultant deterioration of the signal-to-noise ratio can be at least substantially eliminated in a further version of the method in accordance with the invention in that the polarity of the magnetic gradient field activated during the first and the third high-frequency pulse is reversed after the first and the third high-frequency pulse, respectively, in that before the second high-frequency pulse the gradient field is activated with a polarity with opposes that of this field during the second high-frequency pulse, and in that the variation in time of each gradient field activated during a high-frequency pulse is chosen so that the time integral between the centre of the first or the third high-frequency pulse and the instant of deactivation of the relevant gradient field, or between the instant of activation of the gradient field and the centre of the second high-frequency pulse, is zero.

This version of the method in accordance with the invention is based on the recognition of the fact that the first and the third (90°) high-frequency pulse tilt the vector of the nuclear magnetization from the longitudinal (i.e. the z) direction into the transverse direction (i.e. in the x-y-plane), whilst the second high-frequency pulse tilts the nuclear magnetization from the transverse into the longitudinal direction in a mirror-image fashion. Therefore, the second pulse and the associated magentic gradient field must be the mirror-image in time of the first and the third high-frequency pulse with the respective associated magnetic gradient field. This is ensured by the further version of the method in accordance with the invention.

A device for performing the method in accordance with the invention comprises a magnet for generating a uniform, steady magnetic field, a high-frequency coil system for generating a high-frequency magnetic field which extends perpendicularly to the steady magnetic field, a high-frequency generator for powering the high-frequency coil system, a gradient coil system for generating magnetic fields which extend in the direction of the steady magnetic field and which have gradients extending in different directions, generators for powering the gradient coils, a control unit for controlling the high-frequency generator and the other generators, and an arithmetic device for processing the stimulated echo signal, and is characterized in that the control unit is programmed so that magnetic gradient fields are activated during the intervals between the three high-frequency pulses as well as between the third high-frequency pulse and the instant of occurrence of the stimulated echo signal, the gradients of the gradient fields activated during the interval after the first high-frequency pulse and after the third high-frequency pulse extending in the same direction and the condition I1=I3 being satisfied, where I1 and I3 denote the time integral over the gradient during the interval after the first and after the third high-frequency pulse, respectively, the gradient of the gradient field activated during the interval after the second high-frequency pulse extending perpendicularly to the gradients of the gradient fields activated after the first and after the third interval, respectively, and/or the condition I1=I2/n being satisfied, where I2 is the time integral over the magnetic gradient field after the second high-frequency pulse and n is a positive or negative number whose absolute value deviates from 1 and 2, the arithmetic unit being constructed so as to perform a Fourier transformation.

Figure 2:
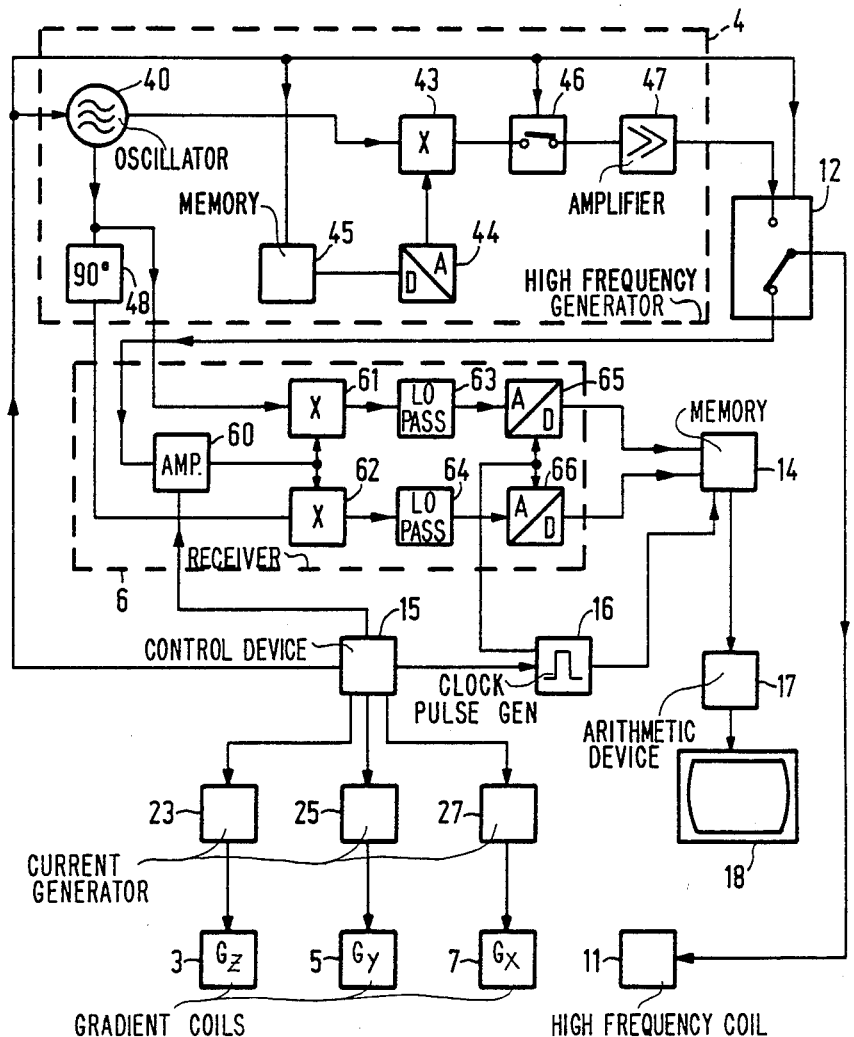
Figure 3:
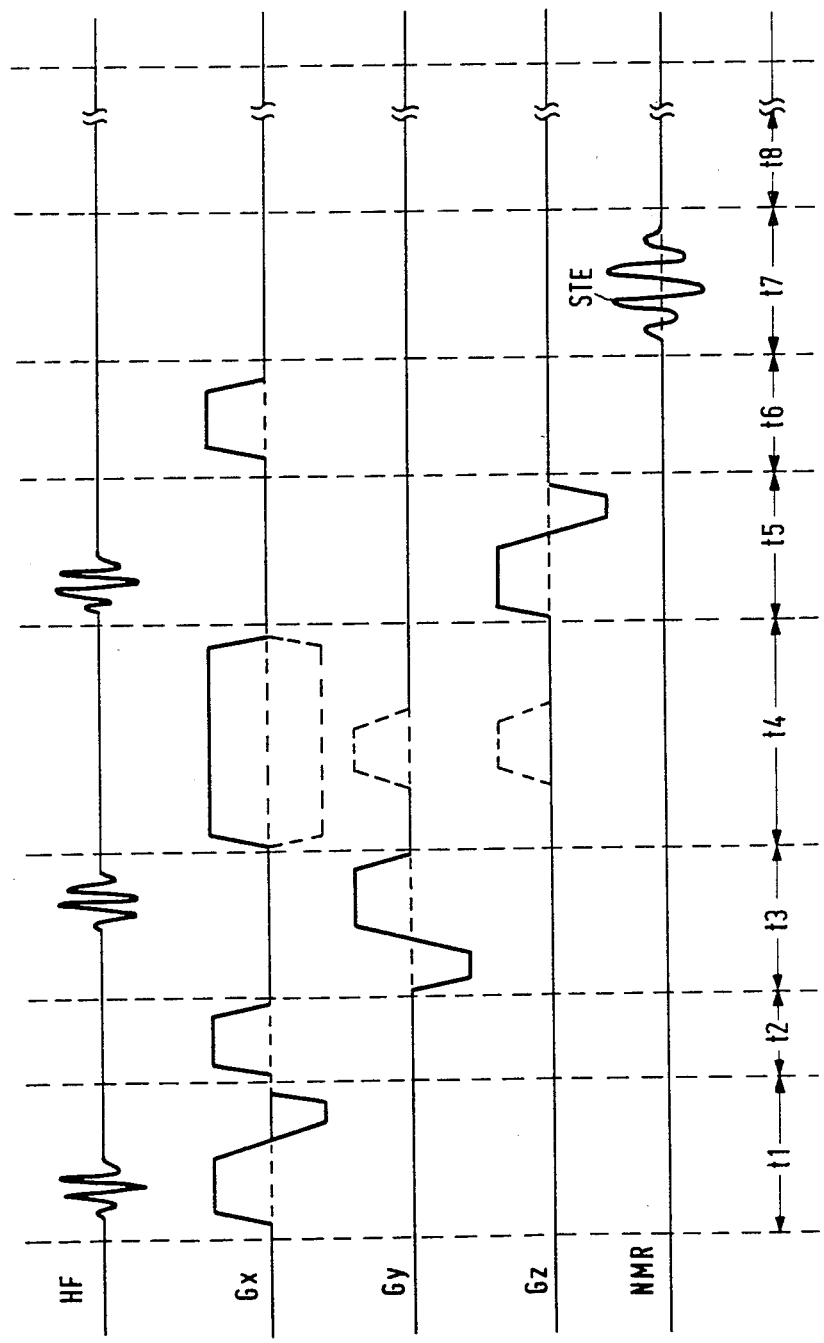

The invention will be described in detail hereinafter with reference to the drawings. Therein:

FIG. 1 shows a magnetic resonance imaging apparatus for performing a method in accordance with the invention, FIG. 2 shows a block diagram of such an apparatus, and FIG. 3 shows the variation in time of various signals during the execution of the method in accordance with the invention.

The magentic resonance imaging apparatus which is diagrammatically shown in FIG. 1 comprises a device for generating a steady, uniform magnetic field which consists of four coils 1, the intensity of the magnetic field amounting from some tenths of T to some T. This field extends in the z-direction of a cartesian system of coordinates. The coils 1 are arranged concentrically with respect to the z-axis and may be situated on a spherical surface 2. The patient 20 to be examined is arranged inside these coils.

In order to generate a magnetic field Gz which extends in the z-direction and which linearly varies in this direction there are provided four coils 3 which are arranged preferably on the same spheical surface. There are also provided four coils 7 which generate a magnetic gradient field (i.e. a magnetic field whose intensity varies linearly in one direction) Gx which also extends in the z-direction but whose gradient extends in the x-direction. A magnetic gradient field Gy which extends in the z-direction and which has a gradient in the y-direction is generated by four coils 5 which may be identical to the coils 7 but which are arranged so as to be offset 90° in space with respect thereto. Only two of these four coils are shown in FIG. 1.

Because each of the three coils systems 3, 5 and 7 for generating the magnetic gradient fields Gz, Gy and Gx is symmetrically arranged with respect to the spherical surface 2, the field strength at the centre of the sphere, also forming the origin of the above-mentioned cartesian system of coordinates xyz, is determined only by the steady, uniform magnetic field of the coil system 1. Furthermore, a high-frequency coil 11 is arranged symmetrically with respect to the plane z=0 of the coordinate system, this coil being constructed so that it generates and essentially uniform high-frequency magnetic field which extends in the x-direction, that is to say perpendicularly with respect to the direction of the steady, uniform magnetic field. During each high-frequency pulse, a high-frequency modulated current is applied to the high-frequency coil by a high-frequency generator. After three high-frequency pulses, the high-frequency coil 11 serves for the reception of the stimulated echo signal formed in the examination zone. However, use can alternatively be made of a separate high-frequency receiving coil.

FIG. 2 shows a simplified block diagram of the described magnetic resonance imaging apparatus. Via a switching device 12, the high-frequency coil 11 is connected on the one side to a high-frequency generator 4 and on the other side to a high-frequency receiver 6.

The high-frequency generator 4 includes a variable-frequency high-frequency oscillator 40 which produces oscillations having a frequency equal to the Larmor frequency of the nuclei to be excited for the field strength produced by the coils 1. As is known, the Larmor frequency f can be calculated from the relation $f=cB$, where B is the magnetic induction in the steady, uniform magnetic field and c is the gyromagnetic ratio which amounts, for example for protons to 42.56 MHz/T. The output of the oscillator 40 is connected to an input of a mixing stage 43. The mixing stage 43 receives a second input signal from a digital-to-analog converter 44 whose output is connected to a digital memory 45. Under the control of a control device 15, a series of digital data words, forming an envelope signal, is read from the memory.

The mixing stage 43 processes the input signals applied thereto so that the carrier oscillation modulated by the envelope signal appears on its output. The output signal of the mixing stage 43 is applied, via a switch 46 which is controlled by the control device 15, to a high-frequency power amplifier 47 whose output is connected to the switching device 12. This device is also controlled by the control device 15.

The receiver 6 includes a high-frequency amplifier 60 which is connected to the switching device and which receives the stimulated echo signal induced in the high-frequency coil 11; to this end, the switching device should occupy the appropriate switching position. The amplifier 60 includes a squelch input which is controlled by the control device 15 and which can be used to block the amplifier so that its gain is substantially zero. The output of the amplifier is connected to the first inputs of two multiplying mixing stages 61 and 62, each of which supplied an output signal which corresponds to the product of their input signals. The second inputs of the mixing stages 61 and 62 receive a signal having the frequency of the oscillator 40, a phase shift of 90° occurring between the signals on the two inputs. This phase shift is produced by means of a 90° phase shifter 48 whose output is connected to the input of the mixing stage 62 and whose input is connected to the input of the mixing stage 61 as well as to the output of the oscillator 40.

The output signals of the mixing stages 61 and 62 are applied, via low-pass filters 63 and 64 which cut off the frequency supplied by the oscillator 40 as well as all frequencies higher than the oscillator frequency and which conduct lower frequency components, to a respective analog-to-digital converter 65, 66, respectively. The latter converts the analog signals of the circuit 61 ... 64, forming a quadrature demodulator, into digital data words which are applied to a memory 14. The analog-to-digital converters 65 and 66 as well as the memory 14 receive their clock pulses from a clock pulse generator 16 which can be blocked and enabled, via a control line, by the control device 15, so that the signals which are supplied by the high-frequency coil 11 and which are transposed to the low-frequency range can be converted into digital data words for storage in the memory 14 only during a measurement interval which is defined by the control device 15.

The three coil systems 3, 5 and 7 are powered by current generators 23, 25 and 27 with a current whose variation in time can be controlled by the control unit 15. The data words and sampling values stored in the memory 14 are applied to an arithmetic device 17 which determines, using a discrete Fourier transformation, the spectral distribution of the nuclear magnetization therefrom and which outputs the distribution thus determined via a suitable display unit, for example a monitor 18.

FIG. 3 shows the variation in time of various signals received or generated by the circuit shown in FIG. 2 for carrying out the method in accordance with the invention. The first line shows the variation in time of the output signal of the high-frequency generator 4. The second, the third and the fourth line show the variation in time of the magnetic gradient fields Gx, Gy, Gz, respectively, which are generated by means of the coil systems 7, 5, 3, respectively, and the generators 27, 25, 23, respectively. The fifth line shows the variation in time of the signal on one of the low-pass filters 63, 64.

The method in accordance with the invention comprises eight consecutive time intervals t1 ... t8. During the intervals t1, t3 and t5, each time a high-frequency pulse, preferably a 90° high-frequency pulse is generated, i.e. the switch 46 is then closed, and the switch 12 occupies the position which is not shown in FIG. 2. The central frequency of each high-frequency pulse is determined by the frequency of the oscillator 40. This frequency must correspond to the Larmor frequency of the nuclei to be excited at the predetermined field strength of the steady, uniform magnetic field generated by the coils 1. The bandwidth of the high-frequency pulses and their variation in time depend on the variation in time of the envelope signal stored in the memory 45.

During the first time interval t1, the magnetic gradient field Gx is activated, i.e. so that it is constant during the entire high-frequency pulse. It is thus achieved that the first high-frequency pulse excites the nuclear magnetization in a layer which extends perpendicularly with respect to the x-axis and whose thickness is determined by the bandwidth of the high-frequency pulse and the magnitude of the gradient of the magnetic gradient field. After the high-frequency pulse, the polarity of the magnetic gradient field is reversed and the magnetic gradient field Gx is deactivated still within the time interval t1. The variation in time of the magnetic gradient field is chosen so that the time integral over this gradient field is zero between the centre of the high-frequency pulse and the instant of deactivation. It is thus achieved that the phase position of the nuclear magnetization in the excited layer is independent of the x-coordinate.

Analogously, the nuclear magnetization is excited in a layer perpendicular to the z-direction during the fifth interval t5 by activation of a magnetic gradient field Gz.

Should the magnetic gradient field Gy have the same variation in time during the third interval t3 as the gradient fields Gx or Gz during the first interval t1 or the fifth interval t5, respectively, the nuclear magnetization at the area of intersection of the layers excited by the three high-frequency pulses would be partly dephased. Such dephasing is avoided in that, as appears from the second line of FIG. 3, prior to the second high-frequency pulse in the time interval t3 the magnetic gradient field Gy, having a gradient extending in the y-direction, is activated so that the nuclear magnetization in the layer which is excited by the first high-frequency pulse and which extends perpendicularly to the x-axis is dephased in the y-direction. Because the polarity of this gradient field is reversed, so that during the second high-frequency pulse this field has the opposite polarity with respect to that immediately therebefore, and because the variation in time of the magnetic gradient field is chosen so that the time integral over this field between the instant of activation and the centre of the second high-frequency pulse is zero, such dephasing is eliminated again. This improves the signal-to-noise ratio of the stimulated echo signal which occurs during the seventh time interval t7 and which is determined only by the nuclear magnetization at the area of intersection of the three layers.

During the seventh time interval t7 a stimulated echo signal appears which is determined only by the nuclear magnetization at the area of intersection of the three layers. This signal is converted into an electric signal by the coil 11 for application, via the switch 12, to the receiver 6 in which it is converted into a series of digital sampling values for storage in the memory 14, followed by Fourier transformation in the arithmetic device 17. The clock generator 16 generates clock pulses only during the time interval t7, so that only the sampling values occurring during this time interval can be stored. The distance between the centre of the stimulated echo signal and the centre of the third high-frequency pulse correspond to the distance in time between the centres of the first two high-frequency pulses.

During the time intervals t2, t4, t6 after the first, the second and the third high-frequency pulse, respectively, i.e. after deactivation of the magnetic gradient field associated with the relevant high-frequency pulse, magnetic gradient fields are generated in order to suppress all other types of spin resonance signals. During the time interval t2 a magnetic gradient field is generated whose time integral deviates from zero. The gradient of this field may extend in an arbitrary direction. In the present embodiment, it is assumed that the gradient extends in the x-direction. During the time interval t6 after the third high-frequency pulse, a magnetic gradient field is generated whose gradient extends in the same direction as the gradient of the magnetic gradient field activated during the time interval t2 and whose time integral corresponds to the time integral over the magnetic gradient field activated during the time interval t2. During the time interval t4 between the second and the third high-frequency pulse, a magnetic gradient field is activated whose gradient has the same direction and polarity as the gradient of the magnetic gradient fields activated during the time intervals t2 and t6. However, the time integral over this magnetic gradient field is three times larger than the corresponding integral for the time intervals t2 and t6.

Each of the three magnetic gradient fields activated during the time intervals t2, t4, t6 in principle causes an amount of dephasing or a phase shift which is proportional to the time integral over the magnetic gradient field during the relevant time interval. Moreover, the phase shift is also proportional to the distance x from the origin of the cartesian coordinate system. The dephasing caused by the magnetic gradient fields activated during the time intervals t2, t4, t6 will be referred to hereinafter as I1, I2, I3, respectively. It is assumed that I1 and I3 are equal, while I2 is three times larger than I1 or I3.

The following table illustrates the effect of the various dephasing occurrences on the various types of spin resonance signals. The reference STE denotes the stimulated echo signal, SE denotes the spin echo signal and FID denotes the FID signal. The number stated between parentheses denotes the relevant high-frequency pulse for each signal.

| | |
|---|---|
| STE (1,2,3) | I1 − I3 = 0 |
| SE (1,2) | I1 − I2 − I3 |
| SE (1,3) | I1 + I2 − I3 |
| SE (2,3) | I2 − I3 |
| SE (1,2,3) | I1 − I2 + I3 |
| FID (1) | I1 + I2 + I3 |
| FID (2) | I2 + I3 |
| FID (3) | I3 |

It will be apparent that the phase shift for the stimulated echo signal is zero, because the dephasing by the magnetic gradient fields after the first and the second high-frequency pulse is opposed and equal for this signal. It also appears that for all other spin resonance signals the dephasing deviates from zero for the given value of I3. Therefore, these signals are suppressed in the case of adequate dephasing, i.e. when the condition $dx I1 > 2\pi/c$ is satisfied. Therein, dx is the thickness of the layer extending perpendicularly to the x-axis, i.e. the layer whereto the gradient extends perpendicularly during the second time interval t2 or the sixth interval t6, and c is the gyromagnetic ratio.

The table also shows that equally good results are obtained when the condition $I1$ or $I3 = -3I2$ is satisfied. As is denoted by broken lines, the gradient in the x-direction may also have a negative polarity during the time interval t4. On the other hand, it can also be seen that also the signals SE (2,3) or FID (2) would not be dephased if the condition I2=I3 or I2= −I3 were satisfied; it also appears that the signals SE (1,2) or SE (1,2,3) would not be suppressed if I2 were equal to 2I3 or if I2 were equal to −2I3. Because I2 may not be zero, in order to ensure that the signal SE (1,3) is suppressed, it is necessary to satisfy the condition that the absolute value of I2 must be at least three times larger than that of I1 or I3 when the gradient during the time interval t4 extends in the same or the opposite direction with respect to the gradient during the time interval t2 or t6.

However, it is alternatively possible to suppress the other spin resonance signals by activating, during the time interval t4, a magnetic gradient field whose gradient does not extend in the same or the opposite direction with respect to the gradient during the time intervals t2 or t6. When the gradient of the magnetic gradient field activated during the time interval t4 extends, for example in the y-direction or the z-direction, all signals which are dependent on I2 can be suppressed. The signal FID(3) which is generated by the third high-frequency pulse and which is independent (like the stimulated echo signal STE) from the magnetic gradient field between the second and the third high-frequency pulse, is suppressed by the magnetic gradient field activated during the time interval t6.

Thus, in these cases the generator 27 for the gradient coils 7 may remain inactive during the time interval t4 and instead the generator 23 or 25 can generate a magnetic gradient field Gy or Gz whose variation in time is proportioned so that the absolute value of the time integral over this magnetic field during this interval corresponds to this value for the time interval t2 or t6.

What is claimed is:

1. A method of determining the spectral distribution of nuclear magnetization in a limited volume comprising the steps of:
    producing a steady, uniform magnetic field in an examination zone;
    acting on said examination zone by means of repetitive sequences of three high frequency pulses spaced apart by predetermined time intervals, the pulses occurring during respective time intervals t1, t3 and t5;
    producing a directional magnetic gradient field in conjunction with each of said pulses, the direction of the gradient of said magnetic gradient field being varied 90° from each of said high frequency pulses to the next;
    generating a stimulated echo signal during an echo time interval following said third pulse, said echo signal occurring in said examination zone in response to said three pulses and said fields;
    producing a directional magnetic gradient field during each time interval t2 and t4 between the first and second pulses and between the second and third pulses, respectively, as well as during a time interval t6 between the third pulse and the stimulated echo signal, the gradient of the gradient field produced in the time interval t2 after the first high frequency pulse and in the time interval t6 after the third high frequency pulse extending in the same direction, the time integral of the gradient in the time interval t2 being substantially equal to the time integral of the gradient in the time interval t6, the direction, duration and intensity of the gradient field produced during the interval t4 being selected to suppress residual spin echo signals substantially without affecting said stimulated echo signal;
    sampling said stimulated echo signal; and
    processing said sampled signal by Fourier transformation to produce the spectral distribution of nuclear magnetization in said limited volume.

2. A method according to claim 1 wherein:
    said step of producing a directional magnetic gradient field during the time interval t4 between the second and third high frequency pulses comprises producing a gradient field having a gradient extending perpendicular to the gradients of the gradient fields produced in the intervals t2 and t6 after the first and third high frequency pulses.

3. A method according to claim 1 wherein:
    the time integral of the gradient of the gradient field produced in time interval t4 between the second and third high frequency pulses is related in amplitude to the time integral of the gradient of the gradient field produced in the interval t2 after the first high frequency pulse by a factor n, where n is a whole number greater than two and having either a negative or a positive sign.

4. A method according to either claim 1 or claim 2 wherein:
    said three high frequency pulses are 90° high frequency pulses.

5. A method according to either claim 1 or claim 2 wherein in the step of producing a directional magnetic gradent field in conjunction with each of said three high frequency pulses, the magnetic gradient fields produced in conjunction with ones of said pulses each have two polarities, the polarities of the gradient fields produced in conjunction with said first and third pulses each being reversed following the occurrence of the respective first and third pulses, and the magnetic gradient field applied during the second high frequency pulse is preceded in time by an opposite polarity magnetic gradient field, each of said magnetic gradient fields having an amplitude versus time variation such that the integral with respect to time of the gradient field produced in conjunction with said first pulse between the occurrence of the center of the first pulse and the deactivation of the related gradient field is zero, the integral with respect to time of the gradient field produced in conjunction with said third pulse between the occurrence of the center of said third pulse and the deactivation of the related gradient field is zero, and the integral with respect to time of the gradient field produced in conjunction with said third pulse between activation of said last-named gradient field and the occurrence of the center of said second pulse is zero.

6. Apparatus for determining the spectral distribution of the nuclear magnetization in a limited volume comprising;
    a magnet for generating a steady uniform magnetic field;
    a high frequency coil system for generating a high frequency magnetic field which extends perpendicular to the steady uniform magnetic field;
    high frequency generator means for energizing the high frequency coil system with repetitive sequences of three high frequency pulses spaced apart by predetermined time intervals, the pulses occurring during respective time intervals t1, t3 and t5;
    a gradient coil system for generating magnetic fields which extend in the direction of the steady magnetic field and which have gradients extending in different directions;
    a plurality of other generator means for energizing the gradient coils in conjunction with each of said pulses such that the directions of said gradients are varied 90° from each of said high frequency pulses to the next;
    a control unit for controlling operation of the high frequency and other generator means "in such a manner that a stimulated echo signal is generated from said limited volume following the third of said high frequency pulses; and";
    said other generator means further comprises energizing means for said gradient coils for producing a directional magnetic gradient field during each time interval t2 and t4 between the first and second pulses and between the second and third pulses, respectively, as well as during a time interval t6 between the third pulse and the stimulated echo signal, the gradient of the gradient field produced in the time interval t2 after the first high frequency pulse and in the time interval t6 after the third high frequency pulse extending in the same direction, the time integral of the gradient in the time interval t2 being substantially equal to the time integral of the gradient in the time interval t6, the direction, duration and intensity of the gradient field produced during the interval t4 being selected to suppress residual spin echo signals substantially without affecting said stimulated echo signal;

arithmetic means for sampling said stimulated echo signal; and means for processing said sampled signal by Fourier transformation to produce the spectral distribution of nuclear magnetization in said limited volume.

7. Apparatus according to claim 6 wherein:

said energizing means of said other generator means arranged for producing a directional magnetic gradient field during a time interval t4 between the second and third high frequency pulses further comprises means for producing a gradient field having a gradient extending perpendicular to the gradients of the gradient fields produced in intervals t2 and t6 after the first and third high frequency pulses.

8. Apparatus according to claim 6 wherein:

said energizing means of said other generator means is arranged for producing gradients of the gradient fields wherein the time integral of the gradient of the gradient field produced in time interval t4 between the second and third high frequency pulses is related in amplitude to the time integral of the gradient of the gradient field produced in the interval t2 after the first high frequency pulse by a factor n, where n is a whole number greater than two and having either a negative or a positive sign.

* * * * *